(12) United States Patent
Jeong et al.

(10) Patent No.: US 12,484,303 B2
(45) Date of Patent: Nov. 25, 2025

(54) DISPLAY PANEL INCLUDING SUBSTRATE INCLUDING RESIN LAYER HAVING UPPER SURFACE MODIFIED BY A PLASMA TREATMENT

(71) Applicant: Samsung Display Co., LTD., Yongin-si (KR)

(72) Inventors: Jaewoo Jeong, Suwon-si (KR); Taesung Kim, Suwon-si (KR); Hyunmin Cho, Hwaseong-si (KR); Taewook Kang, Seongnam-si (KR); Byung Soo So, Yongin-si (KR)

(73) Assignee: Samsung Display Co., LTD., Gyeonggi-do (KR)

( * ) Notice: Subject to any disclaimer, the term of this patent is extended or adjusted under 35 U.S.C. 154(b) by 601 days.

(21) Appl. No.: 17/825,510

(22) Filed: May 26, 2022

(65) Prior Publication Data

US 2023/0100985 A1 Mar. 30, 2023

(30) Foreign Application Priority Data

Sep. 29, 2021 (KR) ........................ 10-2021-0128976

(51) Int. Cl.
*H10D 86/40* (2025.01)
*H01L 21/02* (2006.01)
*H10D 86/01* (2025.01)
*H10K 59/12* (2023.01)
*H10K 77/10* (2023.01)

(52) U.S. Cl.
CPC ..... *H10D 86/411* (2025.01); *H01L 21/02376* (2013.01); *H10D 86/0212* (2025.01); *H10K 77/111* (2023.02); *H10K 59/1201* (2023.02)

(58) Field of Classification Search
CPC ............. H10D 86/0212; H10D 86/411; H10K 59/1201; H10K 77/111; H01L 21/02376
See application file for complete search history.

(56) References Cited

U.S. PATENT DOCUMENTS 6,211,072 B1 * 4/2001 Brennan ................. C23C 16/36
438/654
6,472,080 B1 * 10/2002 Inagaki ...................... C08J 7/12
427/535

(Continued)

FOREIGN PATENT DOCUMENTS

KR 10-20190119700 A 10/2019
KR 10-20200108218 A 9/2020

OTHER PUBLICATIONS

Korean Office Action issued Jun. 13, 2025 in Korean Patent Application No. 10-2021-0128976.

*Primary Examiner* — Yara B Green
*Assistant Examiner* — Christopher M Roland
(74) *Attorney, Agent, or Firm* — Harness, Dickey & Pierce, P.L.C.

(57) ABSTRACT

A display panel according to an embodiment includes a substrate, a thin film transistor disposed on the substrate, and a light emitting element electrically connected to the thin film transistor. The substrate includes a first resin layer, a first barrier layer disposed on the first resin layer, a second resin layer including a lower portion disposed on the first barrier layer and an upper portion having a carbon content less than a carbon content of the lower portion, and a second barrier layer disposed on the second resin layer.

15 Claims, 12 Drawing Sheets

(56) References Cited

U.S. PATENT DOCUMENTS

| | | | |
|---|---|---|---|
| 10,910,406 B2 | 2/2021 | Jeong et al. | |
| 2003/0001278 A1* | 1/2003 | Kojima | H01L 23/53295 |
| | | | 257/E21.279 |
| 2003/0201465 A1* | 10/2003 | Ryuzaki | H01L 21/76832 |
| | | | 257/200 |
| 2004/0089924 A1* | 5/2004 | Yuasa | H01L 23/53295 |
| | | | 257/673 |
| 2005/0186801 A1* | 8/2005 | Uno | H01L 21/02126 |
| | | | 257/E21.252 |
| 2007/0128886 A1* | 6/2007 | Ogihara | G03F 7/0752 |
| | | | 438/702 |
| 2009/0053526 A1* | 2/2009 | Arita | B32B 27/00 |
| | | | 428/411.1 |
| 2019/0319050 A1* | 10/2019 | Jeong | H10D 86/0212 |
| 2020/0288563 A1 | 9/2020 | Nam et al. | |

\* cited by examiner (b)

(a)

DISPLAY PANEL INCLUDING SUBSTRATE INCLUDING RESIN LAYER HAVING UPPER SURFACE MODIFIED BY A PLASMA TREATMENT

CROSS-REFERENCE TO RELATED APPLICATION(S)

This application claims priority to the benefits from Korean Patent Application No. 10-2021-0128976 under 35 U.S.C. § 119, filed on Sep. 29, 2021 in the Korean Intellectual Property Office, the entire contents of which are incorporated herein by reference.

BACKGROUND

1. Technical Field

Embodiments relate to a display panel and method of manufacturing the same. Embodiments relate to a flexible display panel and method of manufacturing such flexible displays.

2. Description of the Related Art

Flat panel display devices are replacing cathode ray tube display devices as display devices due to their lightweight and thin characteristics. As representative examples of such flat panel display devices, there are liquid crystal display devices and organic light emitting diode display devices.

When a display panel included in the display device has flexibility, at least a portion of the display panel may be bent. Therefore, a visibility of the display panel from various angles may be improved, and an area of a non-display region may be decreased. In a method of manufacturing the display panel in which at least a portion thereof is bent, methods for minimizing or reducing damage and manufacturing cost have been studied.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments of the disclosure provide a display panel with improved reliability.

Embodiments of the disclosure also provide a method of manufacturing a display panel with reduced manufacturing cost.

Additional features of the embodiments will be set forth in the description which follows, and in part will be apparent from the description, or may be learned by practice of the embodiments.

A display panel according to an embodiment may include a substrate, a thin film transistor disposed on the substrate, and a light emitting element electrically connected to the thin film transistor. The substrate may include a first resin layer, a first barrier layer disposed on the first resin layer, a second resin layer including a lower portion disposed on the first barrier layer and an upper portion having a carbon content less than a carbon content of the lower portion, and a second barrier layer disposed on the second resin layer.

In an embodiment, the upper portion of the second resin layer may have conductivity.

In an embodiment, the upper portion of the second resin layer may block an electrical field from the thin film transistor.

In an embodiment, the carbon content of the upper portion of the second resin layer may gradually increase in a downward direction from an upper surface of the second resin layer.

In an embodiment, the carbon content of the lower portion of the second resin layer may be constant in an upward direction from a lower surface of the second resin layer.

In an embodiment, an oxygen content of the upper portion of the second resin layer may be greater than an oxygen content of the lower portion of the second resin layer.

In an embodiment, the oxygen content of the upper portion of the second resin layer may gradually decrease in a downward direction from an upper surface of the second resin layer.

In an embodiment, the oxygen content of the lower portion of the second resin layer may be constant in an upward direction from a lower surface of the second resin layer.

In an embodiment, the second resin layer and the first resin layer may include a same material. A carbon content of the first resin layer may be constant in a thickness direction. An oxygen content of the first resin layer may be constant in the thickness direction.

In an embodiment, the carbon content of the upper portion of the second resin layer may be less than the carbon content of the first resin layer.

In an embodiment, the carbon content of the lower portion of the second resin layer may be equal to the carbon content of the first resin layer.

In an embodiment, an oxygen content of the upper portion of the second resin layer may be greater than the oxygen content of the first resin layer.

In an embodiment, an oxygen content of the lower portion of the second resin layer may be equal to the oxygen content of the first resin layer.

In an embodiment, a surface roughness of an upper surface of the second resin layer may be greater than a surface roughness of an upper surface of the first resin layer.

A method of manufacturing a display panel may include forming a first barrier layer on a first resin layer, forming a second resin layer on the first barrier layer, performing a plasma treatment on an upper surface of the second resin layer, forming a second barrier layer on the second resin layer, and forming a thin film transistor and a light emitting element electrically connected to the thin film transistor on the second barrier layer. A carbon content of an upper portion of the second resin layer may be reduced by the performing of the plasma treatment.

In an embodiment, the plasma treatment may use at least one of helium plasma, argon plasma, nitrogen plasma, and fluorine plasma.

In an embodiment, the upper portion of the second resin layer may have conductivity by the performing of the plasma treatment.

In an embodiment, the carbon content of the upper portion of the second resin layer may gradually increase in a downward direction from the upper surface of the second resin layer.

In an embodiment, an oxygen content of the upper portion of the second resin layer may be increased by the performing of the plasma treatment.

In an embodiment, the oxygen content of the upper portion of the second resin layer may gradually decrease in a downward direction from the upper surface of the second resin layer.

The display panel according to embodiments may include the substrate having a multi-layered structure including the first resin layer, the first barrier layer, the second resin layer, and the second barrier layer, and upper structure disposed on the substrate and including the pixels. The upper portion of the second resin layer may have conductivity by performing the plasma treatment. Accordingly, the upper portion of the second resin layer may block an electrical field from electronic elements or wires in the upper structure. Accordingly, the display quality of the display panel may be improved.

It is to be understood that both the foregoing general description and the following detailed description are intended to provide further explanation of the disclosure.

BRIEF DESCRIPTION OF THE DRAWINGS

The above and other aspects and features of the disclosure will become more apparent by describing in detail embodiments thereof with reference to the attached drawings.

DETAILED DESCRIPTION OF THE EMBODIMENTS

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

"About," "substantially," or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
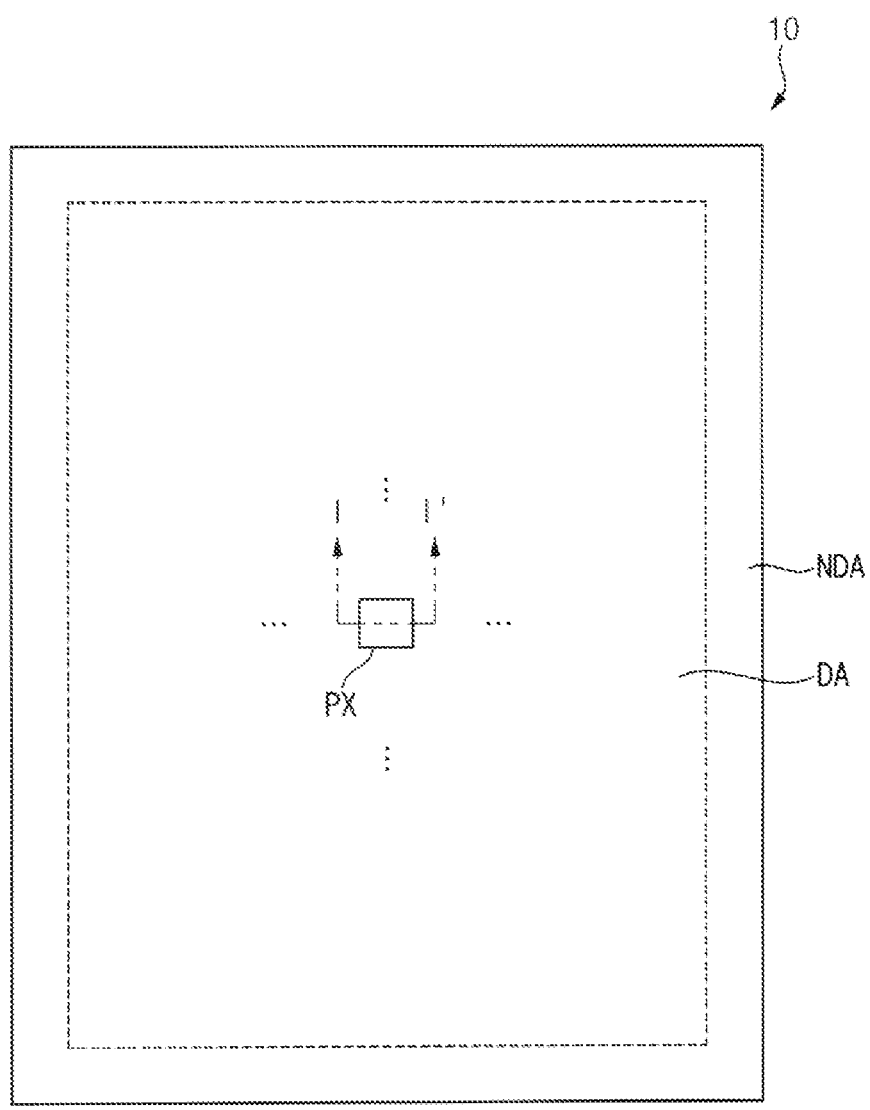
FIG. 1 is a schematic plan view illustrating a display panel according to an embodiment.

FIG. 1 is a schematic plan view illustrating a display panel according to an embodiment.

Referring to FIG. 1, a display panel 10 according to an embodiment may include a display area DA and a non-display area NDA. An image may be displayed in the display area DA. The non-display area NDA may be positioned around the display area DA. For example, the non-display area NDA may be around (or may surround) the display area DA in a plan view.

The display panel 10 may include pixels PX disposed in the display area DA. For example, the pixels PX may be disposed in a matrix form in a plan view.

Each of the pixels PX may include at least one thin film transistor and a light emitting element. The thin film transistor may generate a driving current, and may provide the generated driving current to the light emitting element. The light emitting element may emit light based on the driving current. For example, the light emitting element may include an organic light emitting diode, an inorganic light emitting diode, a quantum dot light emitting diode, or similar element. Light emitted from each of the pixels PX may be combined to generate the image.

Figure 2:
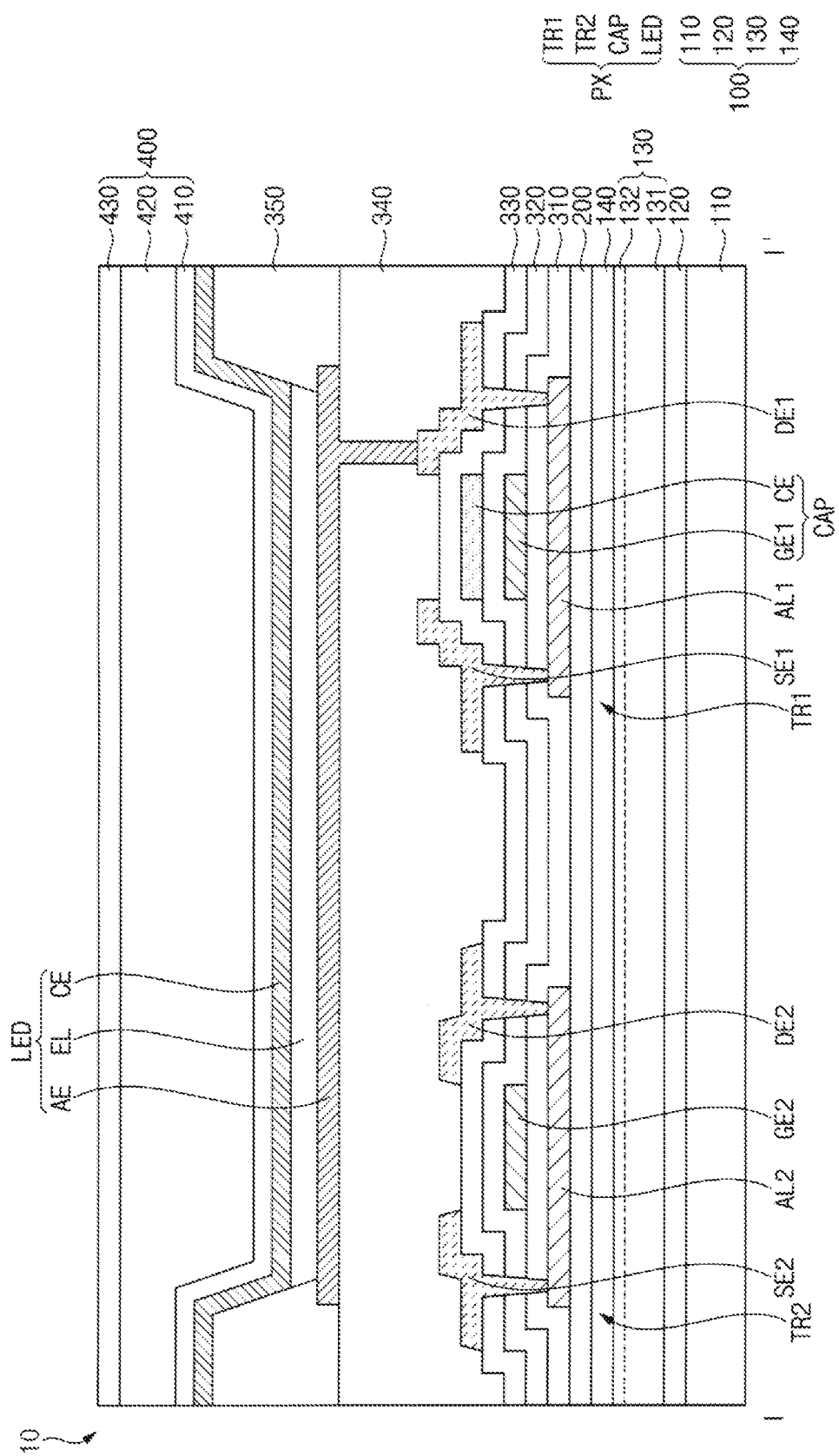
FIG. 2 is a schematic cross-sectional view taken along line I-I' of FIG. 1.
Figure 3:
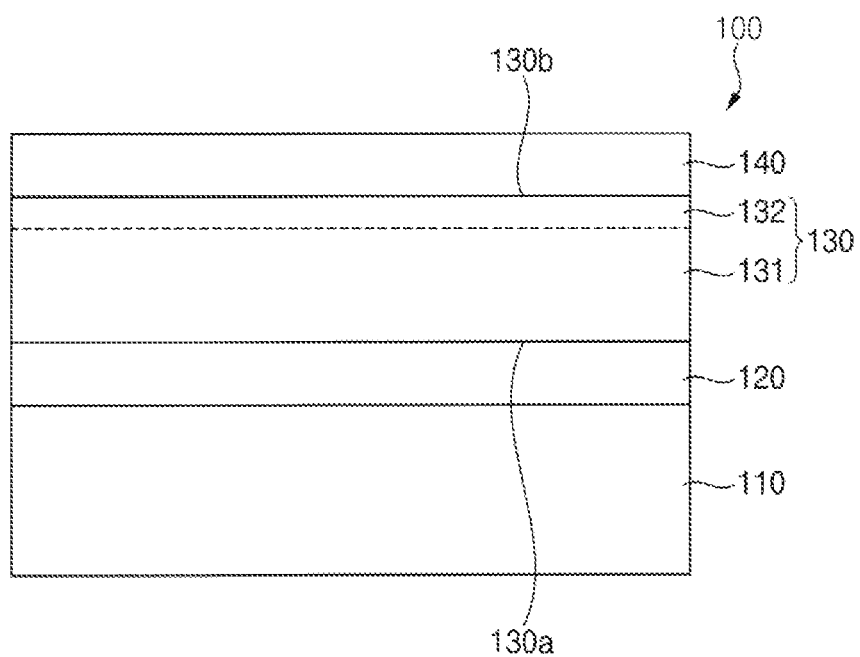
FIG. 3 is an enlarged schematic cross-sectional view of a substrate included in the display panel of FIG. 2.

FIG. 2 is a schematic cross-sectional view taken along line I-I' of FIG. 1. FIG. 3 is an enlarged schematic cross-sectional view of a substrate included in the display panel of FIG. 2.

Referring to FIGS. 1 to 3, in an embodiment, the display panel 10 may include a substrate 100, a buffer layer 200, the pixels PX, and an encapsulation layer 400. Each of the pixels PX may include a first transistor TR1, a second transistor TR2, a capacitor CAP, and the light emitting element LED.

In an embodiment, the substrate 100 may have a multi-layered structure including a first resin layer 110, a first barrier layer 120, a second resin layer 130, and a second barrier layer 140. Each of the first and second resin layers 110 and 130 may include a polymer resin to have flexibility. Each of the first and second barrier layers 120 and 140 may have a relatively thin thickness. Accordingly, the substrate 100 may have flexibility as a whole.

The first resin layer 110 may include a polymer resin. Examples of the polymer resin may include polyimide (PI), polyethersulphone (PES), polyacrylate (PA), polyetherimide (PEI), polyethylene naphthalate (PEN), polyethylene terephthalate (PET), polyphenylene sulfide (PPS), polyarylate (PAR), polycarbonate (PC), cellulose acetate propionate (CAP), or similar materials. These maybe used individually or in a combination. Hereinafter, an example in which the first resin layer 110 includes polyimide will be described.

The first barrier layer 120 may be disposed on the first resin layer 110. The first barrier layer 120 may be disposed between the first resin layer 110 and the second resin layer 130. The first barrier layer 120 may include an inorganic material. Accordingly, the first barrier layer 120 may prevent or reduce impurities such as oxygen or moisture from penetrating into the second resin layer 130 through the first resin layer 110 from an outside (for example, from a lower portion of the first resin layer 110). Examples of the inorganic material may include silicon oxide (SiO), silicon nitride (SiN), silicon oxynitride (SiON), silicon oxycarbide (SiOC), silicon carbonitride (SiCN), aluminum oxide (AlO), aluminum nitride (AlN), tantalum oxide (TaO), hafnium oxide (HfO), zirconium oxide (ZrO), titanium oxide (TiO), or similar materials. These maybe used individually or in a combination.

The second resin layer 130 may be disposed on the first barrier layer 120. The second resin layer 130 may include a polymer resin. For example, the second resin layer 130 and the first resin layer 110 may include substantially the same material.

The second resin layer 130 may include a lower portion 131 adjacent to the first barrier layer 120 and an upper portion 132 adjacent to the second barrier layer 140. The lower portion 131 may include a lower surface 130*a* of the second resin layer 130 that contacts an upper surface of the first barrier layer 120. For example, the lower portion 131 may be a portion having a selected thickness in an upper direction from the lower surface 130*a* of the second resin layer 130. The upper portion 132 may be positioned (or disposed) on the lower portion 131, and may include the upper surface 130*b* of the second resin layer 130 contacting a lower surface of the second barrier layer 140. For example, the upper portion 132 may be a portion having a selected thickness in a downward direction from the upper surface 130*b* of the second resin layer 130. In an embodiment, the thickness of the lower portion 131 may be greater than a thickness of the upper portion 132.

The upper portion 132 may have conductivity. For example, the lower portion 131 may have non-conductivity, and the upper portion 132 may have conductivity. As the upper portion 132 has conductivity, the upper portion 132 may block electrical fields from electronic elements (for example, the first and second transistors TR1 and TR2, the capacitor CAP, or similar elements) or wires positioned on the substrate 100. Accordingly, a dipole moment, which is aligned in a certain direction, may be prevented from being formed in the lower portion 131 and the first resin layer 110. Accordingly, it is possible to prevent a shift in the threshold voltage of driving transistors from being different for each pixel PX due to the dipole moment. Accordingly, an afterimage of the display panel 10 may be improved, and a display quality of the display panel 10 may be improved.

In an embodiment, the carbon content of the upper portion 132 may be less than the carbon content of the lower portion 131. As will be described below in detail with reference to FIGS. 4 to 7, in a manufacturing process of the display panel 10, after the second resin layer 130 is formed on the first barrier layer 120, a plasma treatment of the upper surface 130*b* of the second resin layer 130 may be performed. Accordingly, resistance may be reduced in the upper portion 132 of the second resin layer 130. The upper portion 132 that may have a selected thickness in the downward direction from the upper surface 130*b* of the second resin layer 130 may have conductivity. The upper portion 132 may be defined as an upper portion having conductivity due to the performing of the plasma treatment of the second resin layer 130.

Figure 8:
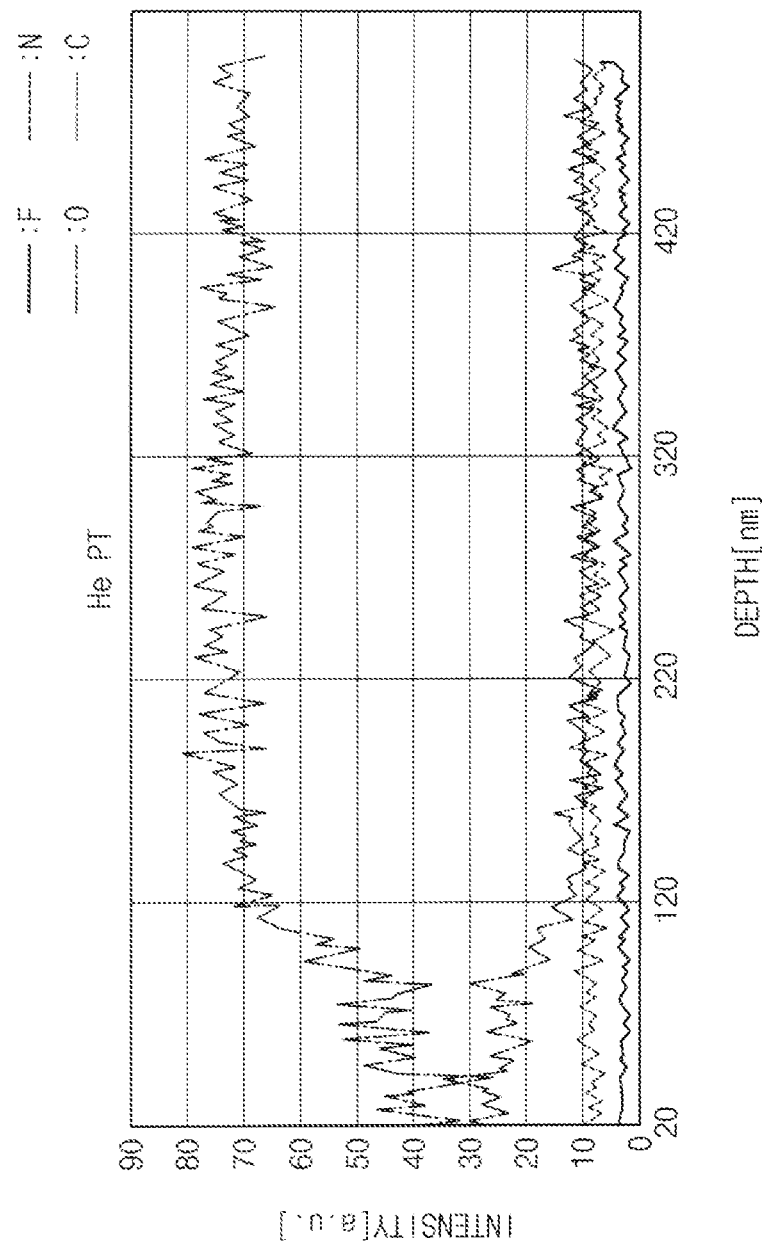
FIG. 8 is a graph illustrating TEM-EDS analysis result of a second resin layer according to Embodiment 2.

For example, the carbon content of the upper portion 132 may gradually increase in the downward direction from the upper surface 130*b* of the second resin layer 130 (refer to FIG. 8). The carbon content of the lower portion 131 may be substantially constant in the upper direction from the lower surface 130*a* of the second resin layer 130. For example, the carbon content in the upper surface 130*b* of the second resin layer 130 may be less than the carbon content in the lower surface 130*a* of the second resin layer 130.

A carbon content of the first resin layer 110 may be substantially constant in a thickness direction (for example, upward and downward direction). For example, the carbon content of the first resin layer 110 may be equal or similar to the carbon content of the lower portion 131 of the second resin layer 130. The carbon content of the upper portion 132 of the second resin layer 130 may be less than the carbon content of the first resin layer 110.

In an embodiment, the oxygen content of the upper portion 132 may be greater than the oxygen content of the lower portion 131. For example, the oxygen content of the upper portion 132 may gradually decrease in the downward direction from the upper surface 130*b* of the second resin layer 130 (refer to FIG. 8). The oxygen content of the lower portion 131 may be substantially constant in the upward direction from the lower surface 130*a* of the second resin layer 130. The oxygen content in the upper surface 130*b* of the second resin layer 130 may be greater than the oxygen content in the lower surface 130*a* of the second resin layer 130.

An oxygen content of the first resin layer 110 may be substantially constant in the thickness direction. For example, the oxygen content of the first resin layer 110 may be equal or similar to the oxygen content of the lower portion 131 of the second resin layer 130. The oxygen content of the upper portion 132 of the second resin layer 130 may be greater than the oxygen content of the first resin layer 110.

In an embodiment, the upper surface 130*b* of the second resin layer 130 may have a different surface shape from the upper surface of the first resin layer 110. For example, by performing the plasma treatment, the unevenness (for example, a concave-convex structure) of the upper surface 130*b* of the second resin layer 130 may be increased (refer to FIG. 9). Accordingly, the surface roughness of the upper surface 130*b* of the second resin layer 130 that has been treated with plasma may be greater than a surface roughness of the upper surface of the first resin layer 110 that has not been treated with plasma.

The second barrier layer 140 may be disposed on the second resin layer 130. The second barrier layer 140 may be disposed between the second resin layer 130 and the buffer layer 200. The second barrier layer 140 may include an inorganic material.

Referring to FIG. 2, the buffer layer 200 may be disposed on the second barrier layer 140. The buffer layer 200 may prevent or reduce impurities such as oxygen or moisture from penetrating into an upper portion of the substrate 100 through the substrate 100. The buffer layer 200 may include an inorganic material.

The first transistor TR1, the second transistor TR2, and the capacitor CAP may be disposed on the buffer layer 200. The first transistor TR1 may include an active layer AL1, a gate electrode GE1, a source electrode SE1, and a drain electrode DE1. The first transistor TR1 may be a driving transistor electrically connected to the light emitting element LED. The second transistor TR2 may include an active layer AL2, a gate electrode GE2, a source electrode SE2, and a drain electrode DE2. The second transistor TR2 may be a switching transistor electrically connected to a data line.

The active layers AL1 and AL2 may be disposed on the buffer layer 200. Each of the active layers AL1 and AL2 may include an oxide semiconductor, a silicon semiconductor, an organic semiconductor, or similar structures. For example, the oxide semiconductor may include at least one oxide of indium (In), gallium (Ga), tin (Sn), zirconium (Zr), vanadium (V), hafnium (Hf), cadmium (Cd), germanium (Ge), chromium (Cr), titanium (Ti), and zinc (Zn). The silicon semiconductor may include an amorphous silicon, a polycrystalline silicon, or similar materials. Each of the active layers AL1 and AL2 may include a source area, a drain area, and a channel area positioned (or disposed) between the source area and the drain area.

A first insulating layer 310 may be disposed on the active layers AL1 and AL2. The first insulating layer 310 may cover the active layers AL1 and AL2 on the buffer layer 200. The first insulating layer 310 may include an inorganic material.

The gate electrodes GE1 and GE2 may be disposed on the first insulating layer 310. The gate electrode GE1 may overlap the channel area of the active layer AL1 in a plan view. The gate electrode GE2 may overlap the channel area of the active layer AL2 in a plan view. Each of the gate electrodes GE1 and GE2 may include a conductive material such as a metal, an alloy, a conductive metal nitride, a conductive metal oxide, a transparent conductive material, or similar materials. Examples of the conductive material may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), alloys containing aluminum, alloys containing silver, alloys containing copper, alloys containing molybdenum, aluminum nitride (AlN), tungsten nitride (WN), titanium nitride (TiN), chromium nitride (CrN), tantalum nitride (TaN), strontium ruthenium oxide (SrRuO), zinc oxide (ZnO), indium tin oxide (ITO), tin oxide (SnO), indium oxide (InO), gallium oxide (GaO), indium zinc oxide (IZO), or similar materials. These materials maybe used individually or in a combination. Each of the gate electrodes GE1 and GE2 may have a single-layered structure or a multi-layered structure including conductive layers.

A second insulating layer 320 may be disposed on the gate electrodes GE1 and GE2. The second insulating layer 320 may cover the gate electrodes GE1 and GE2 that are disposed on the first insulating layer 310. The second insulating layer 320 may include an inorganic material.

A capacitor electrode CE may be disposed on the second insulating layer 320. The capacitor electrode CE may overlap the gate electrode GE1 in a plan view. The gate electrode GE1, the second insulating layer 320, and the capacitor electrode CE may form the capacitor CAP.

A third insulating layer 330 may be disposed on the capacitor electrode CE. The third insulating layer 330 may cover the capacitor electrode CE on the second insulating layer 320. The third insulating layer 330 may include an inorganic material.

The source electrodes SE1 and SE2 and the drain electrodes DE1 and DE2 may be disposed on the third insulating layer 330. The source electrode SE1 and the drain electrode DE1 may be electrically connected to the source area and the drain area of the active layer AL1, respectively. The source electrode SE2 and the drain electrode DE2 may be connected to the source area and the drain area of the active layer AL2, respectively. Each of the source electrodes SE1 and SE2 and the drain electrodes DE1 and DE2 may include a conductive material.

A fourth insulating layer 340 may be disposed on the source electrodes SE1 and SE2 and the drain electrodes DE1 and DE2. The fourth insulating layer 340 may include an organic material.

An anode electrode AE may be disposed on the fourth insulating layer 340. The anode electrode AE may include a conductive material. The anode electrode AE may be connected to the drain electrode DE1 through a contact hole formed in the fourth insulating layer 340. Accordingly, the anode electrode AE may be electrically connected to the first transistor TR1.

A fifth insulating layer 350 may be disposed on the anode electrode AE. The fifth insulating layer 350 may cover a peripheral portion of the anode electrode AE, and may define a pixel opening exposing a central portion of the anode electrode AE. The fifth insulating layer 350 may include an organic material.

An emission layer EL may be disposed on the anode electrode AE. The emission layer EL may be disposed in the pixel opening of the fifth insulating layer 350. In some embodiments, the emission layer EL may include at least one of an organic light emitting material and a quantum dot material.

In an embodiment, the organic light emitting material may include low molecular organic compounds or high molecular organic compounds. Examples of the low molecular organic compounds may include copper phthalocyanine, N,N'-diphenylbenzidine, tris-(8-hydroxyquinoline)aluminum, or similar compounds. Examples of the high molecular organic compounds may include poly(3,4-ethylenedioxythiophene), polyaniline, poly-phenylenevinylene, polyfluorene, or similar compounds. These maybe used individually or in a combination.

In an embodiment, the quantum dot materials may include a core including a Group II-VI compound, a Group III-V compound, a Group IV-VI compound, a Group IV element, and/or a Group IV compound. In an embodiment, the quantum dot may have a core-shell structure including the core and a shell surrounding the core. The shell may protect the core, prevent the core from being chemically degraded, and help the core maintain semiconductor characteristics. The shell may serve as a charging layer for imparting electrophoretic characteristics to the quantum dot.

A cathode electrode CE may be disposed on the emission layer EL. The cathode electrode CE may also be disposed on the fifth insulating layer 350. The cathode electrode CE may include a conductive material. The anode electrode AE, the emission layer EL, and the cathode electrode CE may form the light emitting element LED.

The encapsulation layer 400 may be disposed on the cathode electrode CE. The encapsulation layer 400 may include at least one inorganic encapsulation layer and at least one organic encapsulation layer. In an embodiment, the encapsulation layer 400 may include a first inorganic encapsulation layer 410 disposed on the cathode electrode CE, an organic encapsulation layer 420 disposed on the first inorganic encapsulation layer 410, and a second inorganic encapsulation layer 430 disposed on the organic encapsulation layer 420.

In some embodiments, the substrate 100 may have a multi-layered structure including the first resin layer 110, the first barrier layer 120, the second resin layer 130, and the second barrier layer 140. The upper portion 132 of the second resin layer 130 may have conductivity due to the plasma treatment. Accordingly, the upper portion 132 may block electrical fields from electronic elements (for example, the first and second transistors TR1 and TR2, the capacitor CAP, or similar elements) or wires positioned on the substrate 100. Accordingly, a dipole moment, which is aligned in a direction, may be prevented from being formed in the lower portion 131 and the first resin layer 110. Accordingly, the afterimage of the display panel 10 may be improved, and the display quality of the display panel 10 may be improved.

FIGS. 4 to 7 are cross-sectional views illustrating a method of manufacturing the display panel of FIG. 2.

Figure 4:
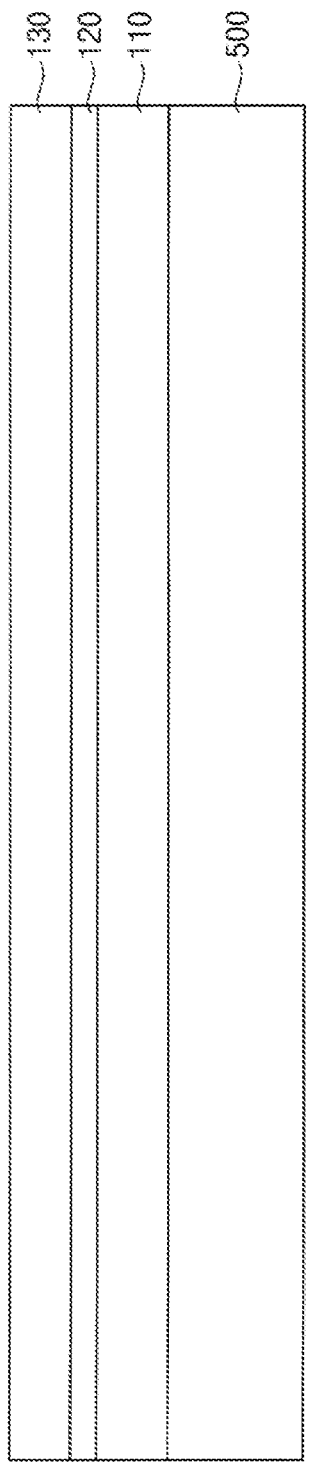
FIGS. 4 to 7 are schematic cross-sectional views illustrating a method of manufacturing the display panel of FIG. 2.

Referring to FIG. 4, the first resin layer 110 may be formed on a carrier substrate 500 using an organic material (for example, polyimide). The first resin layer 110 may be formed by spin coating, inkjet printing, chemical vapor deposition, spraying, or a similar process.

The first barrier layer 120 may be formed on the first resin layer 110 using an inorganic material. The first barrier layer 120 may be formed by sputtering, vacuum deposition, chemical vapor deposition, or a similar process.

The second resin layer 130 may be formed on the first barrier layer 120 using the same material as the first resin layer 110. The second resin layer 130 may be formed by spin coating, inkjet printing, chemical vapor deposition, spraying, or similar process. For example, each of the first and second resin layers 110 and 130 may not be conductive. The carbon content and oxygen content of each of the first and second resin layers 110 and 130 may be substantially constant in the thickness direction.

Figure 5:
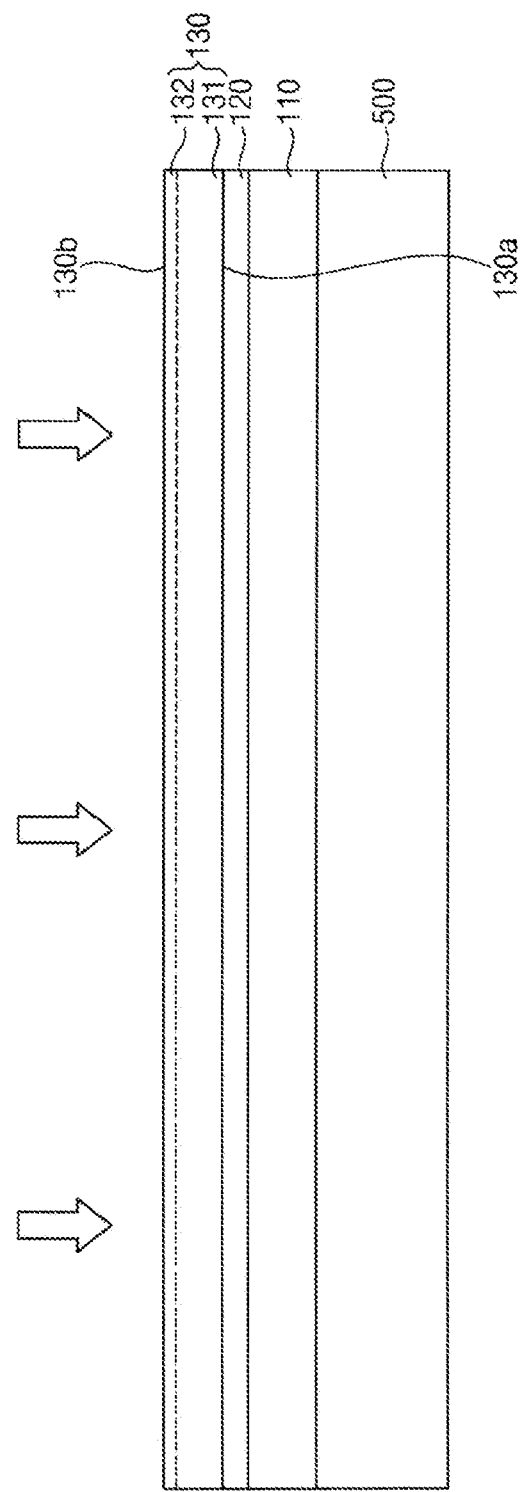

Referring to FIG. 5, a plasma treatment may be performed on the upper surface 130b of the second resin layer 130. By performing the plasma treatment, the upper portion 132, which may have a selected thickness in the downward direction from the upper surface 130b of the second resin layer 130 may be cured and may become conductive. The lower portion 131, which may have a thickness in the upper direction from the lower surface 130a of the second resin layer 130 and the first resin layer 110 may not be affected by the plasma treatment. Accordingly, the lower portion 131 of the second resin layer 130 and the first resin layer 110 may still be non-conductive after the plasma treatment.

In an embodiment, by performing the plasma treatment, the carbon content of the upper portion 132 may become less than the carbon content of the lower portion 131. For example, the carbon content of the upper portion 132 may gradually increase in the downward direction from the upper surface 130b of the second resin layer 130 (refer to FIG. 8). The carbon content of the lower portion 131 may be substantially constant in the upper direction from the lower surface 130a of the second resin layer 130. By performing the plasma treatment, the carbon content in the upper surface 130b of the second resin layer 130 may be less than the carbon content in the lower surface 130a of the second resin layer 130.

In an embodiment, by performing the plasma treatment, the oxygen content of the upper portion 132 may become greater than the oxygen content of the lower portion 131. For example, the oxygen content of the upper portion 132 may gradually decreased in the downward direction from the upper surface 130b of the second resin layer 130 (refer to FIG. 8). The oxygen content of the lower portion 131 may be substantially constant in the upward direction from the lower surface 130a of the second resin layer 130. By performing the plasma treatment, the oxygen content of the upper surface 130b of the second resin layer 130 may become greater than the oxygen content of the lower surface 130a of the second resin layer 130.

In an embodiment, by performing the plasma treatment, a surface shape of the upper surface 130b of the second resin layer 130 may be changed. For example, by performing the plasma treatment, the unevenness (for example, a concave-convex structure) of the upper surface 130b of the second resin layer 130 may be increased (refer to FIG. 9). Accordingly, the surface roughness of the upper surface 130b of the second resin layer 130, that was treated with plasma, may be greater than the surface roughness of the upper surface of the first resin layer 110 that was not treated with plasma.

In an embodiment, the plasma treatment may be performed using helium plasma, argon plasma, nitrogen plasma, or fluorine plasma, but the embodiments are not limited thereto. For example, the plasma treatment may be performed using inductively coupled plasma (ICP) treatment equipment. The treatment conditions of the plasma treatment may be appropriately set in consideration of the type of plasma and other factors.

In an embodiment, in case that the plasma treatment is performed using helium plasma or argon plasma, the pressure may be greater than or equal to about 40 mT and less than or equal to about 150 mT. The source power may be about 2000 W. However, the embodiments are not limited thereto.

In an embodiment, in case that the plasma treatment is performed using helium plasma and a bias power is not applied, an afterimage improvement effect may not appear. In addition, in case that the bias power is greater than or equal to about 500 W, vertical crosstalk may be exacerbated (refer to FIGS. 10 and 12). Accordingly, the bias power may be greater than about 0 W and less than about 500 W. For example, the bias power may be greater than about 100 W and less than about 400 W.

Figure 11:
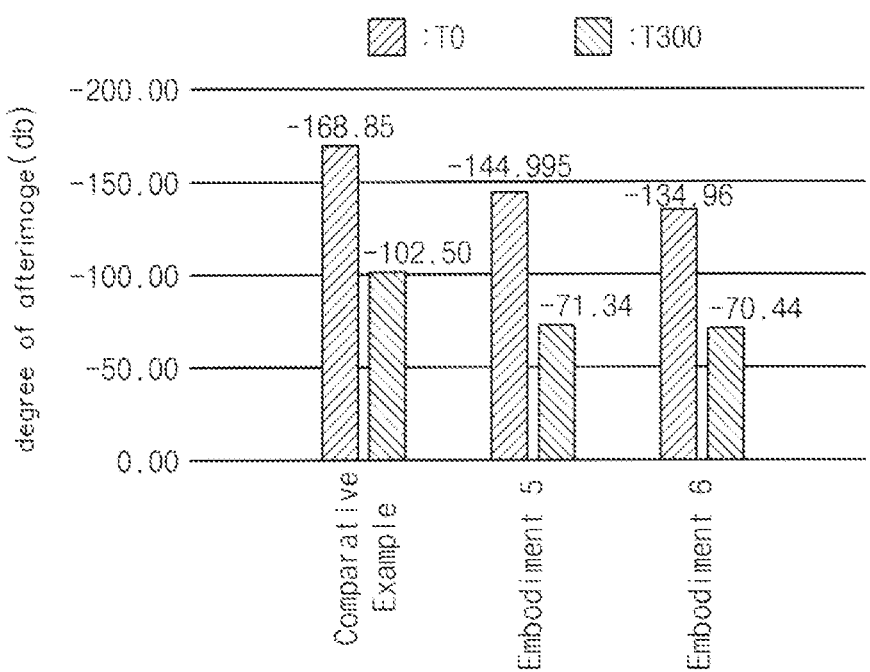
Figure 12:
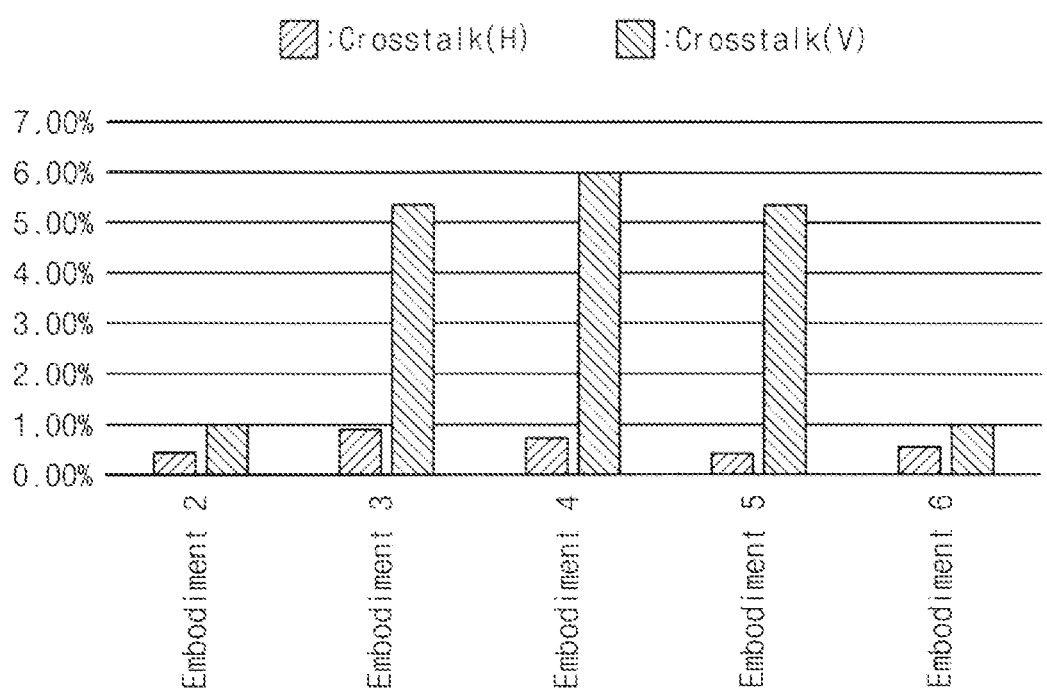
FIG. 12 is a graph illustrating a crosstalk evaluation results of Embodiments 2 to 6.

In an embodiment, in case that the plasma treatment is performed using argon plasma and the bias power is less than or equal to about 500 W, the afterimage improvement effect may be reduced and the vertical crosstalk may be exacerbated (refer to FIGS. 11 and 12). Accordingly, the bias power may be greater than about 500 W. For example, the bias power may be greater than about 700 W.

Figure 6:
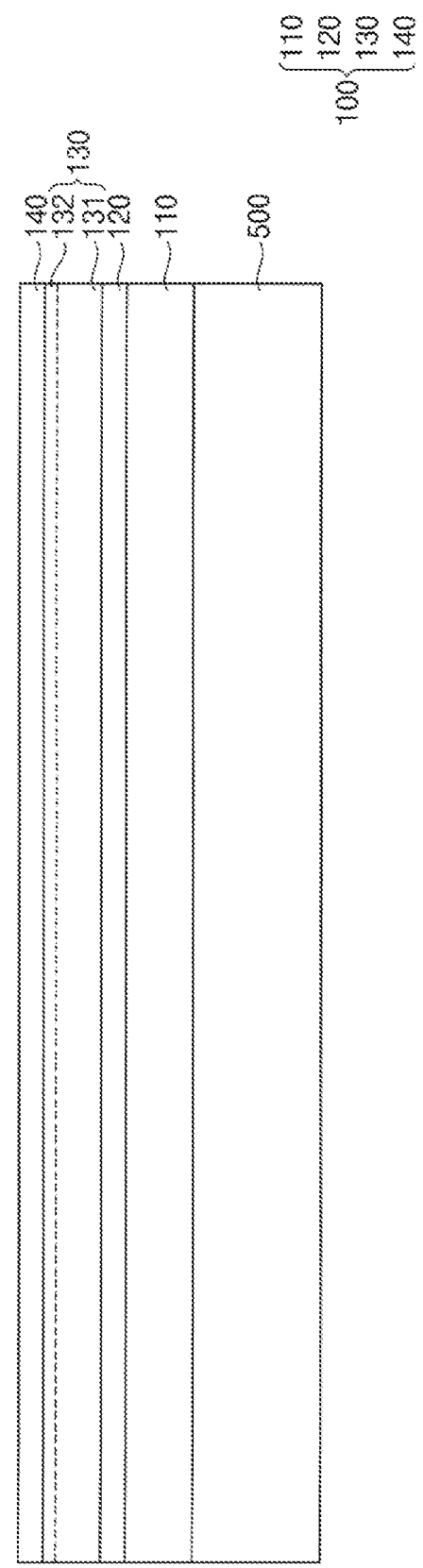

Referring to FIG. 6, the second barrier layer 140 may be formed on the second resin layer 130 performed the plasma treatment. The second barrier layer 140 may be formed by sputtering, vacuum deposition, chemical vapor deposition, or similar process.

Figure 7:
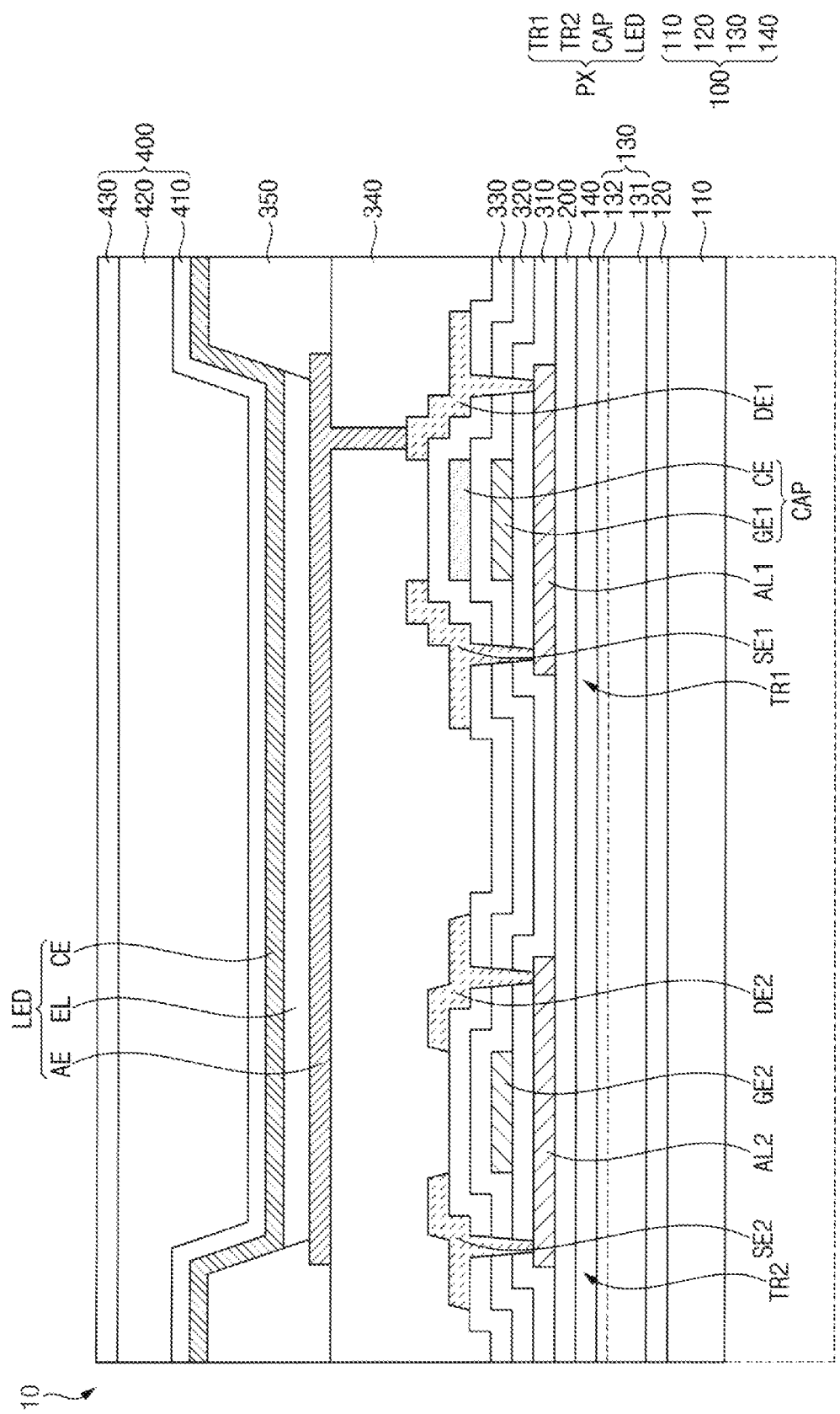

Referring to FIG. 7, the buffer layer 200, the active layers AL1 and AL2, the first insulating layer 310, the gate electrodes GE1 and GE2, the second insulating layer 320, the capacitor electrode CE, the third insulating layer 330, the source electrodes SE1 and SE2 and the drain electrodes DE1 and DE2, the fourth insulating layer 340, the anode electrode AE, the fifth insulating layer 350, the emission layer EL, the cathode electrode CE, the first inorganic encapsulation layer 410, the organic encapsulation layer 420, and the second inorganic encapsulation layer 430 may be sequentially formed on the second barrier layer 140.

In some embodiments, the substrate 100 may have a multi-layered structure including the first resin layer 110, the first barrier layer 120, the second resin layer 130, and the second barrier layer 140. After forming the second resin layer 130, the upper surface 130b of the second resin layer 130 may be performed the plasma treatment. The upper portion 132 of the second resin layer 130 may have conductivity due to the performing of the plasma treatment. After performing the plasma treatment, an upper structure including the second barrier layer 140 and the pixels PX may be formed on the second resin layer 130. Accordingly, the upper portion 132 of the second resin layer 130 may block electrical fields from electronic elements (for example, the first and second transistors TR1 and TR2, the capacitor CAP, or similar elements) or wires positioned (disposed) on the substrate 100. Accordingly, it may be possible to prevent a dipole moment, which is aligned in a direction, from forming in the lower portion 131 and the first resin layer 110. Accordingly, the afterimage of the display panel 10 may be improved, and the display quality of the display panel 10 may be improved.

The vacuum level required for the plasma treatment may be relatively low. In case that ion implantation is performed on the upper surface 130b of the second resin layer 130 to form a conductive film to shield the electrical field, the vacuum level required by the ion implantation process is high, and the manufacturing process of the display panel 10 may become complicated and the manufacturing costs may increase. However, since a vacuum level required for the plasma treatment is lower than the vacuum level required for the ion implantation, the plasma treatment may be performed using existing equipment (for example, chemical vapor deposition equipment, dry etching equipment, or similar equipment). The organic material included in the second resin layer 130 may have a larger surface change by plasma irradiation than by ion implantation, unlike a metal or an inorganic material. Accordingly, the manufacturing process of the display panel 10 may be simplified and the manufacturing costs may be reduced.

Hereinafter, various experiments related to the embodiments and their results will be described.

Comparative Example 1

A first resin layer including polyimide was formed on a carrier glass, a first barrier layer including silicon oxide was formed on the first resin layer, and a second resin layer including polyimide was formed on the first barrier layer. Each of the first resin layer and the second resin layer was formed to a thickness of 5800 nm, and the first barrier layer was formed to a thickness of 500 nm. Subsequently, a second barrier layer, a buffer layer, a thin film transistor, and a light emitting element were formed on the second resin layer to manufacture a display panel.

Embodiments 1 to 6

Compared with Comparative Example 1, after the second resin layer was formed, a plasma treatment of the upper surface of the second resin layer was performed using helium plasma or argon plasma under treatment conditions illustrated in Table 1. Subsequently, a second barrier layer, a buffer layer, a thin film transistor, and a light emitting element were formed on the second resin layer performed the plasma treatment to manufacture a display panel.

TABLE 1

| | type of plasma | pressure (mT) | source power (W) | bias power (W) | flow rate (sccm) | time (s) |
|---|---|---|---|---|---|---|
| Embodiment 1 | He | 80 | 2000 | 0 | 500 | 60 |
| Embodiment 2 | He | 80 | 2000 | 250 | 500 | 30 |

TABLE 1-continued

| | type of plasma | pressure (mT) | source power (W) | bias power (W) | flow rate (sccm) | time (s) |
|---|---|---|---|---|---|---|
| Embodiment 3 | He | 80 | 2000 | 500 | 500 | 30 |
| Embodiment 4 | He | 80 | 2000 | 1000 | 500 | 30 |
| Embodiment 5 | Ar | 40 | 2000 | 500 | 300 | 30 |
| Embodiment 6 | Ar | 40 | 2000 | 1000 | 300 | 30 |

Experimental Example 1: TEM-EDS Analysis of the Second Resin Layer of Embodiment 2

FIG. 8 is a graph illustrating TEM-EDS analysis result of a second resin layer according to Embodiment 2.

Referring to FIG. 8, the composition of an upper portion of the second resin layer, that has a thickness of about 120 nm in a downward direction from the upper surface, may be changed by the plasma treatment. The carbon content of the upper portion gradually increases in the downward direction, and the oxygen content of the upper portion gradually decreases in the downward direction.

Experimental Example 2: Surface Shape Analysis of the Second Resin Layer of Comparative Example and Embodiment 2

Figure 9:
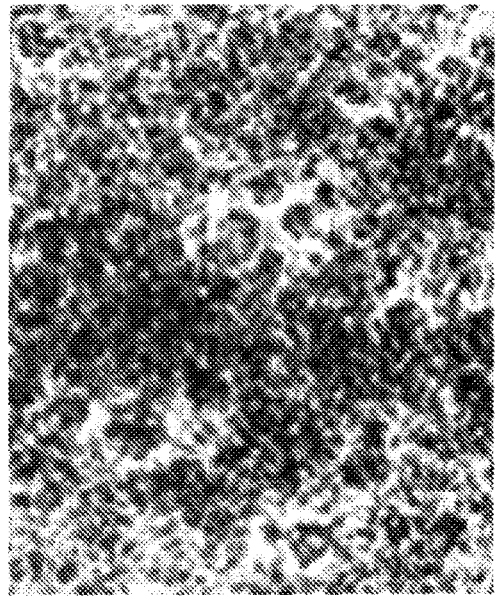
FIG. 9 is an atomic force microscope (AFM) image of a second resin layer according to the Comparative Example and Embodiment 2.
Figure 9:
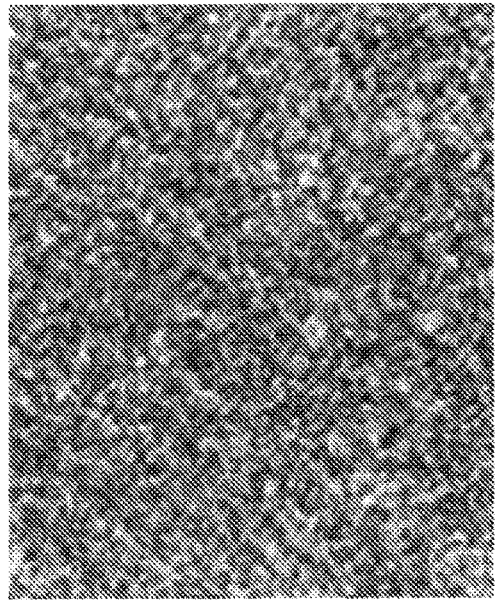

FIG. 9 is an atomic force microscope (AFM) image of the second resin layer according to the Comparative Example and the Embodiment 2. FIG. 9(a) is an AFM image of Comparative Example, FIG. 9(b) is an AFM image of Embodiment 2, and a magnification of each image is about 10×10 μm. Herein, the brighter colors of each image indicate a portion of the surface that is positioned relatively higher, and the darker colors of each image indicate a portion of the surface that is positioned relatively lower.

FIG. 9 may indicate that the surface shape of the upper surface of the second resin layer is modified by performing the plasma treatment. The relatively large differences in brightness and contrast in FIG. 9(b) compared to FIG. 9(a) may indicate that the unevenness of the upper surface of the second resin layer is increased by performing the plasma treatment, and the surface roughness of the second resin layer is increased by performing the plasma treatment.

Experimental Example 3: Transmittance Evaluation of the Second Resin Layer of Comparative Example and Embodiment 2

Table 2 illustrates an evaluation results of Experimental Example 3.

TABLE 2

| | Comparative Example | Embodiment 2 |
|---|---|---|
| transmittance (avg) | 79.0% | 66.5% |
| yellow index (Y.I) | 34.6 | 39.4 |
| contact angle | 11.1° | 63.2° |

Table 2 may indicate that performing the plasma treatment, average transmittance of the second resin layer is reduced, yellowness is increased, and contact angle is increased. Accordingly, the upper surface of the second resin layer may be modified by performing the plasma treatment.

Experimental Example 4: Afterimage Evaluation of Comparative Example and Embodiments 2 to 6

Figure 10:
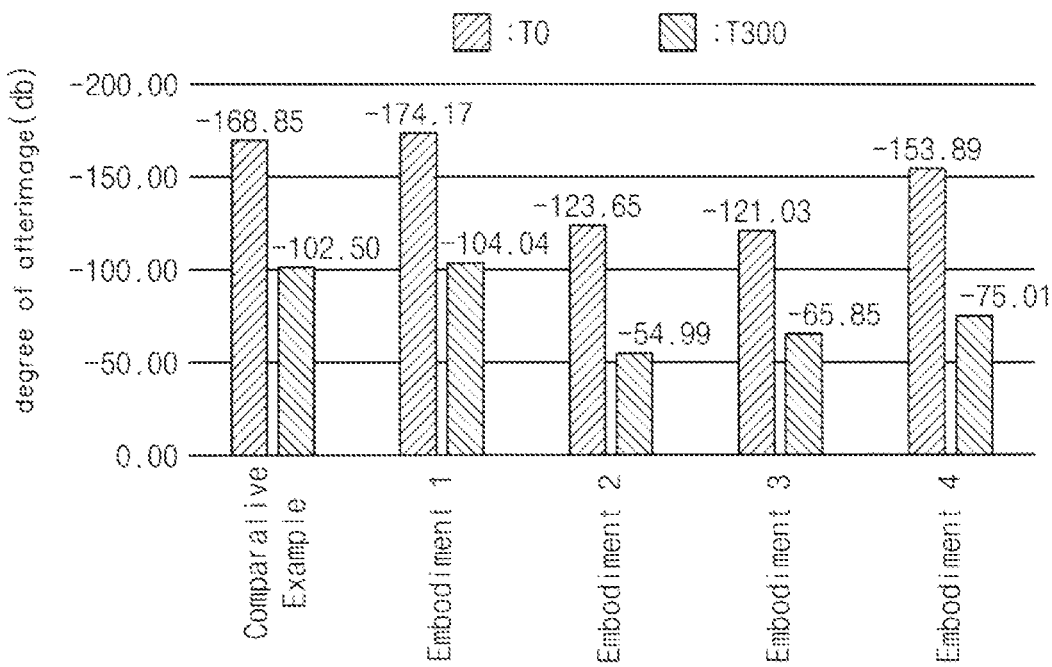
FIGS. 10 and 11 are graphs illustrating afterimage evaluation result of the Comparative Example and Embodiments 1 to 6.

FIGS. 10 and 11 are graphs illustrating afterimage evaluation results comparing the Comparative Example and the Embodiments 1 to 6. FIG. 10 illustrates the afterimage evaluation results of Embodiments 1 to 4 in which plasma treatment was performed using helium plasma, and FIG. 11 illustrates the afterimage evaluation results of Embodiments 5 and 6 in which plasma treatment was performed using argon plasma.

Referring to FIGS. 10 and 11, T0 denotes the degree of afterimage (dB) evaluated by first displaying a checkered pattern on the display panel composed of a maximum grayscale and a minimum grayscale (a checkered pattern of white and black) for 30 minutes and then displaying a single color pattern of a middle grayscale on the display panel. T300 denotes the degree of afterimage (dB) evaluated by first displaying the checkered pattern for 60 minutes, then displaying a single color pattern of a middle grayscale for 5 minutes. The degree of afterimage (dB) that are closer to 0 (or lower degrees of afterimage), may indicate that the afterimage is improved.

Referring to FIG. 10, in case that the bias power is not applied during helium plasma treatment, the afterimage is not improved. Further, as the bias power increases, the afterimage improvement decreases.

Referring to FIG. 11, as the bias power increases during the argon plasma treatment, the afterimage is improved.

Experimental Example 5: Crosstalk Evaluation of Embodiments 2 to 6

FIG. 12 is a graph illustrating a crosstalk evaluation result of Embodiments 2 to 6.

Referring to FIG. 12, in case that the bias power is greater than or equal to about 1000 W during helium plasma treatment (Embodiment 4), the vertical crosstalk may be exacerbated. For argon plasma treatment, in case that the bias power is less than or equal to about 500 W, the vertical crosstalk may be exacerbated.

Figure 13:
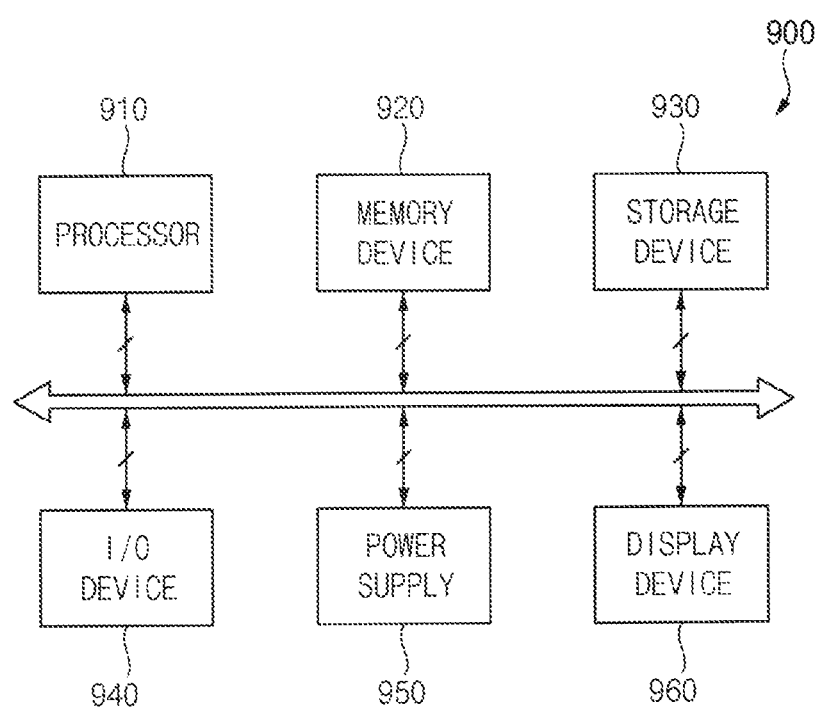
FIG. 13 is a block diagram illustrating an electronic device including the display panel of FIG. 1.

FIG. 13 is a block diagram illustrating an electronic device including the display panel of FIG. 1.

Referring to FIG. 13, in an embodiment, an electronic device 900 may include a processor 910, a memory device 920, a storage device 930, an input/output ("I/O") device 940, a power supply 950, and a display device 960. The display device 960 may include the display panel 10 described with reference to FIGS. 1 to 3. The electronic device 900 may further include ports for communicating with a video card, a sound card, a memory card, a universal serial bus ("USB") device, or other devices. In an embodiment, the electronic device 900 may be implemented as a television. In other examples, the electronic device 900 may be implemented as a smart phone. However, embodiments are not limited thereto, and the electronic device 900 may be implemented as a cellular phone, a video phone, a smart pad, a smart watch, a tablet personal computer ("PC"), a car navigation system, a computer monitor, a laptop, a head mounted display ("HMD"), or other devices.

The processor 910 may perform computing functions. In an embodiment, the processor 910 may be a microprocessor, a central processing unit ("CPU"), an application processor ("AP"), or similar device. The processor 910 may be electrically coupled to other components via an address bus, a control bus, a data bus, or similar structure. In an embodiment, the processor 910 may be coupled to an extended bus such as a peripheral component interconnection ("PCI") bus.

The memory device 920 may store data for operations of the electronic device 900. In an embodiment, the memory device 920 may include at least one non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, or similar device, and/or at least one volatile memory device such as a dynamic random access memory ("DRAM") device, a static random access memory ("SRAM") device, a mobile DRAM device, or similar device.

In an embodiment, the storage device 930 may include a solid state drive ("SSD") device, a hard disk drive ("HDD") device, a CD-ROM device, or similar device. In an embodiment, the I/O device 940 may include an input device such as a keyboard, a keypad, a mouse device, a touchpad, a touch-screen, or similar device, and an output device such as a printer, a speaker, or similar device.

The power supply 950 may provide power for operations of the electronic device 900. The display device 960 may be electrically coupled to other components via the buses or other communication links. In an embodiment, the display device 960 may be included in the I/O device 940.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A display panel comprising:
   a substrate including:
      a first resin layer;
      a first barrier layer disposed on the first resin layer;
      a second resin layer including:
         a lower portion disposed on the first barrier layer; and
         an upper portion having a carbon content less than a carbon content of the lower portion; and
      a second barrier layer disposed on the second resin layer;
   a thin film transistor disposed on the substrate; and
   a light emitting element electrically connected to the thin film transistor, wherein
   the upper portion of the second resin layer is electrically conductive.

2. The display panel of claim 1, wherein chemical and physical properties of the upper portion of the second resin layer are different from the lower portion of the second resin layer by a plasma treatment technique.

3. The display panel of claim 1, wherein
   the upper portion of the second resin layer blocks an electrical field from the thin film transistor, and
   an electrical conductivity of the upper portion of the second resin layer is greater than an electrical conductivity of the lower portion of the second resin layer.

4. The display panel of claim 1, wherein the carbon content of the upper portion of the second resin layer gradually increases in a downward direction from an upper surface of the second resin layer.

5. The display panel of claim 1, wherein a carbon content of the lower portion of the second resin layer is constant in an upward direction from a lower surface of the second resin layer.

6. The display panel of claim 1, wherein an oxygen content of the upper portion of the second resin layer is greater than an oxygen content of the lower portion of the second resin layer.

7. The display panel of claim 6, wherein the oxygen content of the upper portion of the second resin layer gradually decreases in a downward direction from an upper surface of the second resin layer.

8. The display panel of claim 7, wherein the oxygen content of the lower portion of the second resin layer is constant in an upward direction from a lower surface of the second resin layer.

9. The display panel of claim 1, wherein
the second resin layer and the first resin layer include a same material,
a carbon content of the first resin layer is constant in a thickness direction, and
an oxygen content of the first resin layer is constant in the thickness direction.

10. The display panel of claim 9, wherein the carbon content of the upper portion of the second resin layer is less than the carbon content of the first resin layer.

11. The display panel of claim 10, wherein the carbon content of the lower portion of the second resin layer is equal to the carbon content of the first resin layer.

12. The display panel of claim 9, wherein an oxygen content of the upper portion of the second resin layer is greater than the oxygen content of the first resin layer.

13. The display panel of claim 12, wherein an oxygen content of the lower portion of the second resin layer is equal to the oxygen content of the first resin layer.

14. A display panel comprising:
a substrate including:
a first resin layer;
a first barrier layer disposed on the first resin layer;
a second resin layer including:
a lower portion disposed on the first barrier layer; and
an upper portion having a carbon content less than a carbon content of the lower portion; and
a second barrier layer disposed on the second resin layer;
a thin film transistor disposed on the substrate; and
a light emitting element electrically connected to the thin film transistor, wherein a surface roughness of an upper surface of the second resin layer is greater than a surface roughness of an upper surface of the first resin layer.

15. An electronic device comprising:
a display device including a display panel;
a processor configured to perform computing functions for the display device; and
a power supply configured to provide power to the display device, wherein
the display panel includes:
a substrate including:
a first resin layer;
a first barrier layer disposed on the first resin layer;
a second resin layer including:
a lower portion disposed on the first barrier layer; and
an upper portion having a carbon content less than a carbon content of the lower portion; and
a second barrier layer disposed on the second resin layer;
a thin film transistor disposed on the substrate; and
a light emitting element electrically connected to the thin film transistor, and the upper portion of the second resin layer is electrically conductive.

* * * * *